United States Patent
Deng et al.

(10) Patent No.: US 7,729,672 B2
(45) Date of Patent: Jun. 1, 2010

(54) DYNAMIC BIAS CONTROL IN POWER AMPLIFIER

(75) Inventors: Junxiong Deng, San Diego, CA (US); Prasad Gudem, San Diego, CA (US)

(73) Assignee: QUALCOMM, Incorporated, San Diego, CA (US)

(*) Notice: Subject to any disclaimer, the term of this patent is extended or adjusted under 35 U.S.C. 154(b) by 504 days.

(21) Appl. No.: 11/683,913

(22) Filed: Mar. 8, 2007

(65) Prior Publication Data
US 2007/0222519 A1      Sep. 27, 2007

Related U.S. Application Data

(60) Provisional application No. 60/784,539, filed on Mar. 22, 2006.

(51) Int. Cl.
  H04B 1/04    (2006.01)
  H04M 1/00    (2006.01)
(52) U.S. Cl. .................. 455/127.1; 455/552.1; 330/136
(58) Field of Classification Search ............. 455/550.1, 455/552.1, 194.2, 253.2, 309, 311, 341, 127.3, 455/127.1; 330/285, 136, 127
  See application file for complete search history.

(56) References Cited

U.S. PATENT DOCUMENTS

| 5,423,078 A * | 6/1995 | Epperson et al. ......... 455/553.1 |
| 6,111,459 A | 8/2000 | Nishijima et al. |
| 6,606,483 B1 | 8/2003 | Baker et al. |
| 6,804,500 B2 | 10/2004 | Yamaguchi |
| 6,882,194 B2 * | 4/2005 | Belot et al. ................. 327/159 |
| 7,474,880 B2 * | 1/2009 | Pan .......................... 455/127.1 |
| 2007/0080750 A1 * | 4/2007 | Liebenrood ................. 330/252 |

OTHER PUBLICATIONS

International Search Report—PCT/US07/064724—International Search Authority—European Patent Office—Nov. 30, 2007.
Chul Soon Park et al: "An InGaP-GaAs HBT MMIC smart power amplifier for W-CDMA mobile handsets" IEEE Journal of Solid State Circuits, IEEE Service Center, Piscataway, NJ, USA vol. 38, No. 6, Jun. 2003 pp. 905-910, XP011097039.
Written Opinion—PCT/US07/064724—International Search Authority—European Patent Office—Nov. 30, 2007.

* cited by examiner

*Primary Examiner*—Sonny Trinh
(74) *Attorney, Agent, or Firm*—Howard H. Seo; William M. Hooks

(57) ABSTRACT

An RF output power amplifier (PA) of a cellular telephone includes first and second Class AB amplifier circuits. If the cellular telephone is to operate in a high power operating mode, then the first amplifier drives the PA output terminal. The power transistor(s) in the first amplifier is/are biased at a first DC current and a first DC voltage so as to optimize efficiency and linearity at high output powers. If the cellular telephone is to operate in a low power operating mode, then the second amplifier drives the output terminal. The power transistor(s) in the second amplifier is/are biased at a second DC current and a second DC voltage so as to optimize efficiency and linearity at low output powers. By sizing the power transistors in the amplifiers appropriately, emitter current densities are maintained substantially equal so that PA power gain is the same in the two operating modes.

23 Claims, 6 Drawing Sheets

DYNAMIC BIAS CONTROL IN POWER AMPLIFIER

CROSS-REFERENCE TO RELATED APPLICATION

This application claims the benefit under 35 U.S.C. §119 of Provisional Application Ser. No. 60/784,539, filed Mar. 22, 2006, said provisional application is incorporated herein by reference.

BACKGROUND INFORMATION

Technical Field

The disclosed embodiments relate to RF power amplifiers, and more particularly to RF power amplifiers for use in mobile communication devices such as cellular telephone handsets.

BACKGROUND

It is desirable to extend the length of time that a cellular telephone can operate on a single battery charge. The power amplifier is a component of the cellular telephone that consumes a significant portion of all the DC power consumed by the cellular telephone. Increasing the average power efficiency of the power amplifier is therefore desired. Average power efficiency (APE) is the ratio of the RF energy delivered to the antenna to the energy extracted from the battery. To increase the amount of time that the cellular telephone can operate on a single battery charge, the APE of the power amplifier is to be increased. A cellular telephone in operation may be made to transmit in one of numerous different power output levels. In a Wideband Code Division Multiple Access (WCDMA) cellular telephone, for example, the cellular telephone may be made to operate in a "talk" mode or in a "wait" (sometimes called "idle") mode. In the wait mode, user data (for example, speech) is not being communicated, but the transmitter of the cellular telephone nevertheless transmits a minimal amount of management information in order to maintain the wireless link between the cellular telephone and the base station. In the talk mode, the transmitter of the cellular telephone may be made to transmit up to one watt of output power in order to communicate user data. The amount of RF power transmitted in the talk mode may also be decreased somewhat depending on various factors such as the distance to the base station. If the cellular telephone is close to the base station, then it need not transmit at the high output power level that it uses if it is far away from the base station. Much more RF power is to be transmitted in the talk mode when the cellular telephone is far away from the base station as compared to the idle mode when the cellular telephone is close to the base station, but the cellular telephone is seldom in the high power talk mode. The cellular telephone is made to switch from one output power mode to another output power mode during its operation, and the operation of its power amplifier in each mode is to be as efficient as possible so that the overall APE is as great as possible.

A typical power amplifier having transistors of a given physical size can be biased to operate in one of several classes: Class A, Class AB, Class B or Class C. The classes are distinguished from one another by the proportion of the input signal cycle that the transistor of the amplifier is conducting. This proportion is generally referred to as the "conduction angle". A conduction angle of 360 degrees means that the transistor is conductive throughout the entire input signal cycle. A conduction angle of 180 degrees means that the transistor is conductive for half of the input signal cycle. Generally, the greater the conduction angle, the less efficient the amplifier is in generating output power. Conversely, the greater the conduction angle, the more linear the amplifier. Nonlinearity in the power amplifier of a cellular telephone can result in unwanted transmissions into adjacent communication channels used by other cellular telephones. Certain linearity requirements are therefore imposed by the communication standard employed. Accordingly, there is an efficiency to linearity tradeoff in the design of power amplifiers. Due to linearity and efficiency concerns, power amplifiers in cellular telephones are ordinarily operated in Class AB because this mode of operation has just the required linearity for the application. Efficiency is therefore optimized.

If an ordinary Class AB amplifier is driven with a relatively small amplitude input signal and the Class AB amplifier has a fixed power gain, then the amplifier's output signal will be clipped such that the conduction angle of the transistor has a value between 180 and 360 degrees. If, however, the amplitude of the input signal is made larger so that the amplifier will output greater power, then the output signal will generally be clipped to a greater degree. Consequently, the conduction angle of the transistor of the amplifier decreases, thereby reducing linearity. These various interacting effects are considered in designing a power amplifier for a cellular telephone that has the best achievable efficiency and adequate linearity.

In one conventional design methodology, the power amplifier is designed to be particularly efficient when operating in its highest output power by biasing the power amplifier to have just adequate linearity at full power. If the power amplifier were biased in this way, and then the amplitude of the input signal were decreased so that the cellular telephone could operate in a lower power mode, then excess DC power would be consumed in the power amplifier. If less RF output power is required of the amplifier, then less DC power is required. Efficiency is the ratio of delivered RF power versus the amount of DC power consumed by the amplifier. Accordingly, when the power amplifier is to operate in the low power mode, DC power to the power amplifier is reduced a corresponding amount so that power is not wasted when operating in the lower power mode. One of two techniques is generally employed to reduce DC power consumption in a low power mode of a cellular telephone power amplifier.

The first of the techniques is called "dynamic current biasing." There is a DC bias current flowing through the transistor of the power amplifier. This DC bias current is reduced in the low power mode. Unfortunately, changing the current density in the transistor of the amplifier can cause a change in amplifier gain. The electronics upstream of the power amplifier that supplies the input signal to the power amplifier should be able to control the power output of the power amplifier. Changing the power gain of the power amplifier adds complexity to the upstream electronics because there generally must be feedback signals from the power amplifier back to the upstream electronics to facilitate a power control loop. Providing such a power control loop can be a non-trivial matter. Also, the mechanism for supplying the feedback signals adds cost to the power amplifier. Moreover, if the makers of the power amplifier and the drive electronics are different entities, then providing the mechanism for communication of the feedback information may not be possible due to existing and fixed protocols and integrated circuit designs.

The second of the techniques is called "dynamic voltage biasing." Rather than reducing DC power consumption by reducing DC bias current, the DC bias voltage on the collector of the transistor within the power amplifier is reduced. Providing a reduced DC bias voltage in an efficient manner typically involves the use of a DC-to-DC converter and its associated large off-chip components. This is not attractive for small feature size cellular telephone handsets. It also is generally not an integrated solution due to the off-chip components. Providing the DC-to-DC converter, whether on-chip or off-chip, adds substantial cost to the overall design.

SUMMARY

An RF output power amplifier (PA) of a mobile communication device (for example, a cellular telephone) includes a power amplifier input terminal, a driver stage, an analog multiplexer, a first Class AB amplifier circuit, a second Class AB amplifier circuit, a power amplifier output terminal, and an input terminal for receiving a control signal. The power amplifier receives a digital control signal on the control input terminal. The digital value of the digital control signal is indicative of the operating mode of the cellular telephone. One operating mode may, for example, require the power amplifier to output higher average power levels than a second operating mode. If the cellular telephone is operating in this higher output power operating mode then the digital control signal has a first digital logic value, whereas if the cellular telephone is operating in the lower output power operating mode then the digital control signal has a second digital logic value.

If the digital control signal has the first digital value, then the analog multiplexer couples the output of the driver stage to the input of the first Class AB amplifier circuit.

The first Class AB amplifier circuit drives the output terminal of the power amplifier. A power transistor (made up of multiple parallel-connected transistors) in the first Class AB amplifier circuit is biased at a first DC bias collector current and at a first DC bias emitter-to-collector voltage. If, on the other hand, the digital control signal on the control input terminal has the second digital logic value, then the analog multiplexer couples the output of the driver stage to the input of the second Class AB amplifier circuit such that the second Class AB amplifier circuit drives the output terminal of the power amplifier. A power transistor (made up of multiple parallel-connected transistors) in the second Class AB amplifier circuit is biased at a second DC bias collector current and at a second DC bias emitter-to-collector voltage.

Where the first operating mode is a mode that involves operating the power amplifier at higher output powers as compared to the second operating mode, the first DC bias collector current is greater than the second DC bias collector current, and the first DC bias collector-to-emitter voltage is greater than the second DC bias collector-to-emitter voltage. By sizing the power transistors in the first and second Class AB amplifier circuits appropriately, the emitter current densities in the power transistors of the first and second Class AB amplifier circuits are substantially equal in the two operating modes such that the power gain of the overall power amplifier is substantially identical in each of the two operating modes. Switching from one operating mode to the other operating mode does not change the power gain of the power amplifier.

The technique of using a different Class AB amplifier circuit to drive a power amplifier output terminal in each of a plurality of different operating modes can be expanded to involve three or more different Class AB amplifier circuits. The novel power amplifier need not be a discrete power amplifier integrated circuit. For example, the driver amplifier of the transmitter chain of a cellular telephone may use multiple different Class AB amplifier circuits in accordance with the novel technique set forth above. By employing the novel techniques involving multiple different Class AB amplifier circuits, the average power efficiency (APE) of a power amplifier in a cellular telephone can be improved, thereby extending the amount of time that the cellular telephone can be used on a single battery charge.

The foregoing is a summary and thus contains, by necessity, simplifications, generalizations and omissions of detail; consequently, those skilled in the art will appreciate that the summary is illustrative only and does not purport to be limiting. Other aspects, inventive features, and advantages of the devices and/or processes described herein, as defined solely by the claims, will become apparent in the non-limiting detailed description set forth herein.

DETAILED DESCRIPTION

Figure 1:
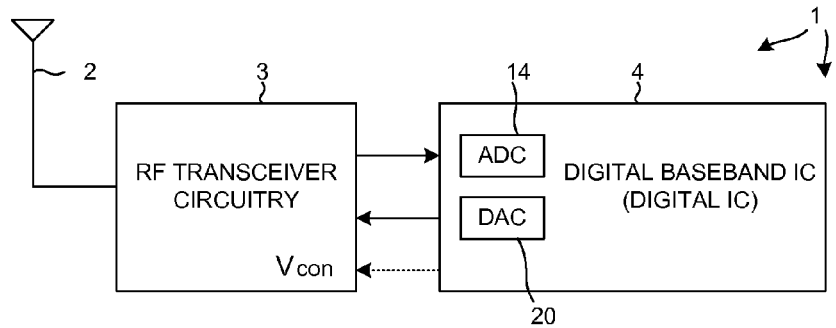
FIG. 1 is a high level diagram of cellular telephone in accordance with one novel aspect.

FIG. 1 is a very simplified high level block diagram of a cellular telephone 1.

Cellular telephone 1 includes an antenna 2, radio frequency (RF) transceiver circuitry 3 and digital baseband integrated circuit 4. Digital baseband integrated circuit 4 includes primarily digital circuitry and includes a digital processor. The RF transceiver circuitry 3 primarily includes analog circuitry.

Figure 2:
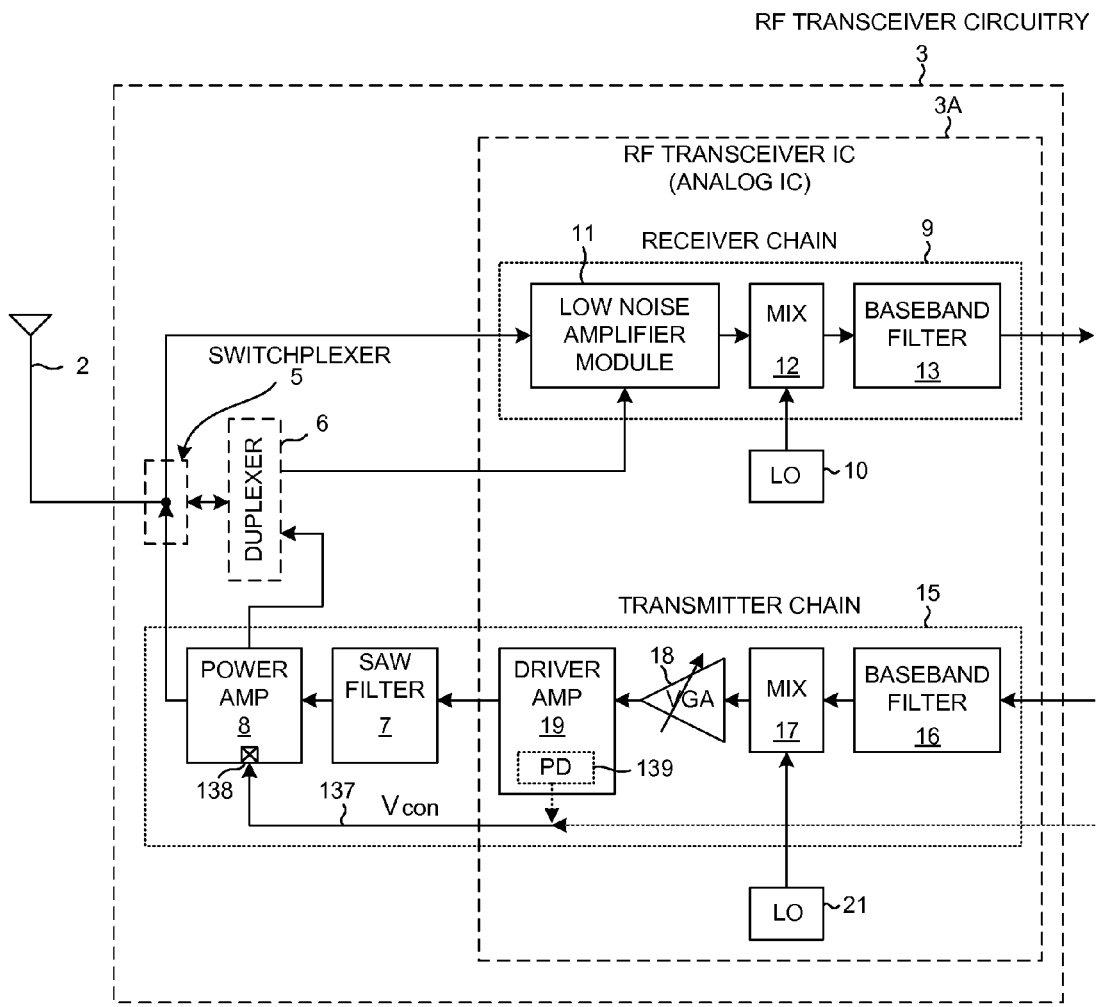
FIG. 2 is a more detailed diagram of the RF transceiver circuitry of the cellular telephone of FIG. 1.

FIG. 2 is a more detailed diagram of RF transceiver circuitry 3. The circuitry includes an RF transceiver integrated circuit 3A and additional discrete components 5-8. The discrete components include a switchplexer 5, a duplexer 6, a SAW filter 7, and a power amplifier 8. The circuitry is called a "transceiver" because it includes a transmitter as well as a receiver. The receiver includes what is called a "signal chain" 9 as well as a local oscillator (LO) 10. The signal chain includes a low noise amplifier (LNA) 11, a mixer 12, and a baseband filter 13. LNA 11 receives the high frequency and low amplitude signal from antenna 2 and amplifies it. The mixer 12 performs demodulation to convert the high frequency signal down to a low frequency signal. The baseband filter 13 receives the low frequency signal, filters out noise, and outputs the resulting information as an analog signal to the digital baseband integrated circuit 4. An analog-to-digital converter 14 in the digital baseband integrated circuit 4 receives the analog signal from RF transceiver circuitry 3 and digitizes the analog signal into digital information. A digital processor in the base band integrated circuit 4 then processes the digital information.

The transmitter portion of RF transceiver circuitry 3 also includes a signal chain 15 and a local oscillator (LO) 21. The signal chain 15 includes a baseband filter 16, a mixer 17, a variable gain amplifier (VGA) 18, and power amplification circuitry. The power amplification circuitry includes a driver amplifier 19, SAW filter 7 and power amplifier 8. Digital information originates in the digital baseband integrated circuit 4 and is converted to analog form by a digital-to-analog converter 20 in the digital baseband integrated circuit 4. The baseband filter 16 in the transmitter signal chain 15 filters out digital noise. The mixer 17 modulates the baseband signal onto a high frequency carrier. VGA 18 and the power amplification circuitry amplify the high frequency signal for driving antenna 2.

In the specific embodiment illustrated here, SAW filter 7 and power amplifier 8 are discrete components that are disposed on a printed circuit board along with RF transceiver integrated circuit 3A. This is but one form of integration. The functionalities of the various components of FIG. 2 can be integrated in different ways depending on the particular target application, target performance, and target cost of the system. For example, the entire transmitter signal chain 15 can be integrated into the RF transceiver integrated circuit 3A.

Figure 3:
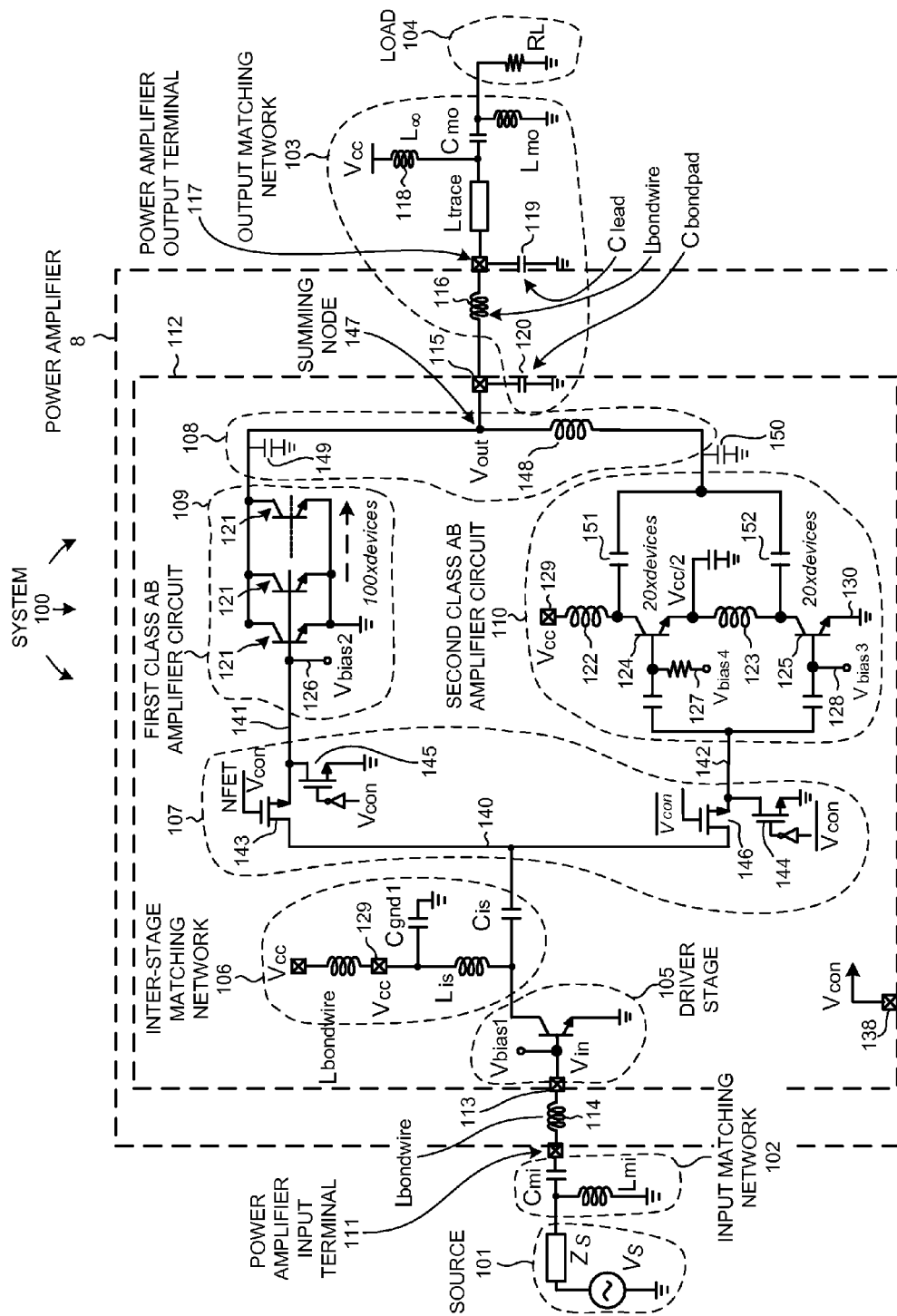
FIG. 3 is a transistor level diagram of the power amplifier of the RF transceiver circuitry of FIG. 2.

FIG. 3 is a simplified transistor-level diagram of power amplifier (PA) 8 implemented in a 0.25 micron silicon germanium (SiGe) BiCMOS process. PA 8 is part of a system 100 that includes a modeled signal source 101, an input matching network 102, an output matching network 103, and a modeled load 104. In the embodiment of FIG. 2, the modeled signal source 101 represents SAW filter 7 from which PA 8 receives an input signal. Modeled load 104 represents switchplexer 5 or duplexer 6 into which PA 8 drives the resulting amplified signal.

PA 8 includes a first stage (referred to here as a "driver stage") 105, an inter-stage matching network 106, an analog multiplexer circuit 107, a second stage, and an output summing network 108. The second stage includes a first Class AB amplifier circuit 109 and a second Class AB amplifier circuit 110. (The analog multiplexer circuit 107 is actually a demultiplexer, but it is referred to here as a multiplexer.)

Reference numeral 111 identifies a power amplifier input terminal. It is a terminal of a package that contains an integrated circuit chip 112. Reference numeral 113 identifies a bond pad for receiving an input signal onto integrated circuit chip 112. Inductor symbol 114 represents the inductance of a bondwire that couples input terminal 111 to bond pad 113. An input signal from source 101 is coupled through input matching network 102 and the inductance 114 to the input of driver stage 105. Input matching network 102 serves to impedance match source 101 to driver stage 105.

Reference numeral 115 identifies a bond pad for outputting an output signal from integrated circuit chip 112. Inductor symbol 116 represents the inductance of a bondwire that couples bond bad 115 to an output terminal 117 of the power amplifier package. The output signal on bond pad 115 is communicated through an impedance matched by output matching network 103 onto load 104.

PA 8 has an operating frequency range of from 1.92 GHz to 1.98 GHz and amplifies input signals in this range with a maximum power gain of approximately 18 dB with a maximum output power of approximately +26 dBm. Duplexer 6 introduces a 2 dB power loss.

Voltage Biasing:

The first Class AB amplifier circuit 109 is voltage biased to have a DC bias collector voltage of the supply voltage Vcc. Under DC conditions, the inductor 118 of output matching network 103 and the inductance 116 are essentially short circuits, whereas the capacitor 119 and the bondpad capacitance 120 are essentially open circuits. The supply voltage Vcc therefore DC voltage biases the collectors of the silicon germanium (SiGe) HBT (heterojunction bipolar transistor) transistors 121 of first Class AB amplifier circuit 109.

Each HBT emitter of transistors 121 is 48 microns by 0.44 microns in size. Transistors 121 include one hundred (100) such HBT transistors coupled in parallel. (Transistors 121 are collectively referred to as a single power transistor elsewhere in this patent document). A ballasting resistor is provided in the emitter of each HBT transistor to increase the emitter resistance $R_E$ to prevent thermal runaway. A lower bound on $R_E$ to prevent thermal runaway is given by equation (1) below.

$$R_E \geq \frac{kT}{qI_C}[(0.05I_C)\theta_{th}V_C - 1] \tag{1}$$

In Equation (1), $I_C$ and $V_C$ are the DC collector bias current and voltage respectively. $\theta_{th} = \Delta T/I_C V_C$ is the thermal resistance. Assuming that $\theta_{th} = 0.33$ C/mW, $I_C = 110$ mA and $v_C = 3V$, equation (1) shows that $R_E \geq 1.1 \Omega$ insures thermal stability.

The second Class AB amplifier circuit 110 is voltage biased to have a DC bias collector-to-emitter voltage of approximately one half of the supply voltage Vcc. Under DC conditions, the inductances 122 and 123 are essentially short circuits. The full supply voltage Vcc is therefore dropped between the collector and emitter of SiGe HBT transistor 124 and the collector and emitter of SiGe HBT transistor 125. Assuming that each of series-connected transistors 124 and 125 drops roughly the same voltage between its collector and its emitter as the other transistor, then the collector-to-emitter voltage drop across the transistors of the second Class AB amplifier circuit is roughly Vcc/2. What is referred to as transistor 124 actually includes twenty (20) parallel-connected SiGe HBT transistors of the HBT structure set forth above in connection with first Class AB amplifier circuit 109. Similarly, what is referred to as transistor 125 actually includes twenty such parallel connected SiGE HBT transistors.

Current Biasing:

DC control bias voltage Vbias2 on conductor 126 is made to be of a magnitude such that the total DC collector current of the bipolar transistors 121 of first Class AB amplifier circuit 109 is approximately 100 milliamperes. First Class AB amplifier circuit 109 is therefore said to be current biased at 100 milliamperes.

Second Class AB amplifier circuit 110 is current biased as follows. First, DC control bias voltage Vbias4 on conductor 127 is set to have a magnitude of approximately 2.1 volts. Second, DC control bias voltage Vbias3 on conductor 128 is set so that a total DC collector current of approximately 20 milliamperes flows in series from a Vcc bond pad 129, through inductance 122, through transistor 124, through inductance 123, through transistor 125, and to a ground conductor 130.

Figure 4:
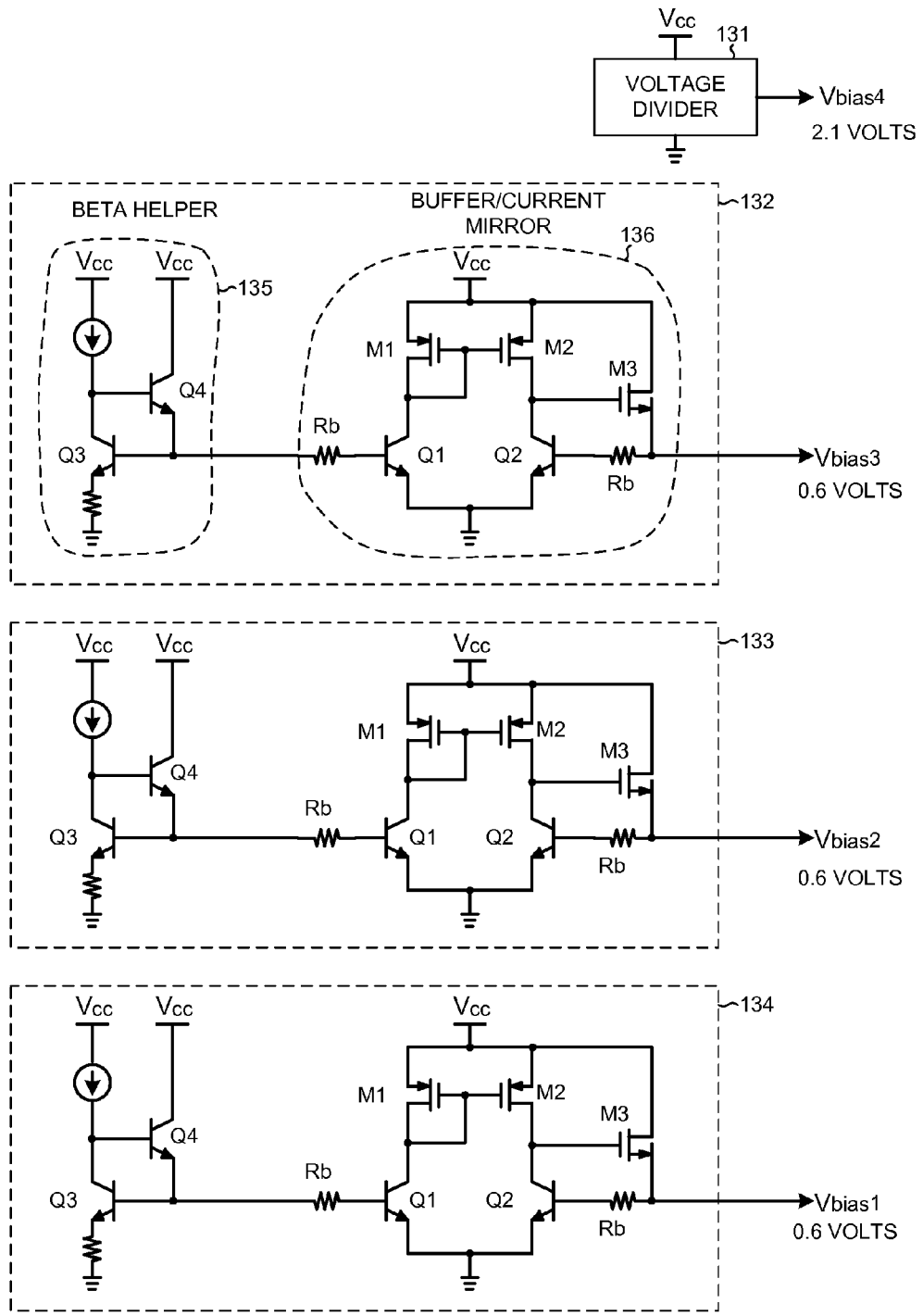
FIG. 4 is a circuit diagram of bias circuits that generate the bias voltages used by the power amplifier of FIG. 3.

FIG. 4 is a diagram of four bias circuits 131-134 that generate the control bias voltages Vbias4, Vbias3, Vbias2 and Vbias1, respectively. Circuit 131 is a resistive voltage divider. Each of the three bias circuits 132-134 has an identical circuit topology. Each includes a beta helper 135 and a current mirror buffer 136. To achieve better linearity, a low DC base impedance is employed for driver stage 105 and for first Class AB amplifier circuit 109. Because the DC current behavior in second Class AB amplifier circuit 110 is determined by transistor(s) 125, a low DC impedance is provided at the base of transistor(s) 125. In this way, when the input power increases, the DC current in transistors 124 and 125 also rises. Consequently, the linearity of second Class AB amplifier circuit 110 improves. On the other hand, the transistor(s) 124 of second Class AB amplifier circuit 110 is biased with a fixed bias voltage through a resistor to the base of transistor 124, thereby eliminating the need for an extra bias inductor because the linearity requirement is readily met at low powers. Accordingly, the bias circuits 132-134 provide a constant voltage bias and terminate the low-frequency components for improved linearity.

The DC impedance $Z_{bias}$ looking into the output of one of the bias circuits 132-134 (the output impedance of the bias circuit) is approximately:

$$Z_{bias}(\Delta\omega) \approx \frac{1}{g_{m\cdot M3} g_{m\cdot Q2} r_{o\cdot Q2}} \quad (2)$$

$g_{m\cdot M3}$ is the transconductance of the M3 transistor. $g_{m\cdot Q2}$ is the transconductance of the Q2 transistor. $r_{o\cdot Q2}$ is the output resistance of transistor Q2. $Z_{bias}(\Delta\omega) \approx 0$ for $\Delta\omega \leq 5$ MHz (i.e. the channel bandwidth for WCDMA handset PAs).

Figure 5:
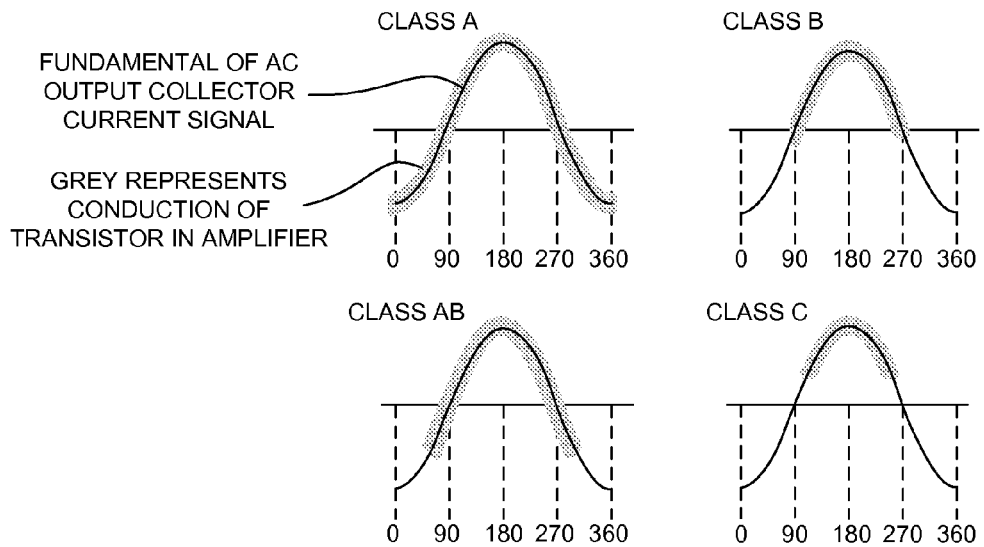
FIG. 5 is a diagram that illustrates a way to identify an amplifier as a Class AB amplifier, as opposed to a Class A, a Class B or a Class C amplifier.

Class AB Circuit Operation:

FIG. 5 is a diagram that illustrates a way to identify an amplifier as a Class AB amplifier, as opposed to a Class A, a Class B or a Class C amplifier. In the diagrams of FIG. 5, the input signal is represented by the sinusoidal line. Transistor conduction is indicated by a thicker grey line. The transistor of a Class A amplifier conducts current throughout the entire cycle (360 degrees) of the input signal. In the Class A amplifier example in the upper left of FIG. 5, the thicker grey line overlays the entire cycle of the input signal, from 0 degrees to 360 degrees. Class A is the least inefficient configuration of the four illustrated configurations.

The transistor of a Class B amplifier conducts current for approximately half of the cycle of the input signal. Note that in the diagram of Class B operation at the upper right of FIG. 5, the thicker grey line only is present from 90 degrees to 270 degrees. The transistor is not conducting current for half of the cycle of the input signal. A Class B amplifier is more efficient than a Class A amplifier.

The transistor of a Class C amplifier conducts current for less than half the cycle of the input signal. Note that in the diagram of Class C operation at the lower right of FIG. 5, the thicker grey line only is present from approximately 100 degrees to approximately 250 degrees. Class C amplifiers are the most efficient of the illustrated amplifier configurations, but Class C amplifiers have the highest non-linearity (distortion) of the illustrated amplifier configurations.

The last illustration in the lower left of FIG. 5 is of a Class AB amplifier. The transistor of a Class AB amplifier conducts current anywhere from approximately 180 to approximately 360 degrees of the cycle of the input signal. Note that in the diagram of Class AB operation, the thicker grey line only is present from approximately 80 degrees to approximately 280 degrees. It is therefore conductive in this example for 200 degrees out of a total 360 degrees of the input signal. Class AB amplifiers are more efficient that Class A amplifiers and have less non-linearity (distortion) than Class B amplifiers.

First and second Class AB amplifier circuits 109 and 110 of power amplifier 8 of FIG. 3 are biased to operate as Class AB amplifiers.

Cellular Telephone Operating Modes:

Cellular telephone 1 of FIG. 1 is operable in one of several operating modes. In each of these operating modes, cellular telephone 1 is to transmit RF energy at a different average RF output power level. Accordingly, power amplifier 8 is to output a different average power to load 104 in each of the different operating modes. Examples of these operating modes may include a "talk mode" and a "wait" mode (sometimes called an "idle" mode). In the operational description below, operation in a first operating mode is to involve a higher average output power level than does operation in a second operating mode. If the cellular telephone is operating in the first operating mode then the signal Vcon has a digital logic high value, whereas if the cellular telephone is operating in the second operating mode then the signal Vcon has a digital logic low value. In one embodiment, digital baseband integrated circuit 4 (see FIG. 1) generates the signal Vcon and supplies it to power amplifier 8 via signal conductor 137 and input terminal 138. In another embodiment, digital baseband integrated circuit 4 does not generate the signal Vcon, but rather a power detector 139 is located somewhere in the transmitter chain. In the example of FIG. 2, power detector 139 is located in driver amplifier 19. If the power being output by the driver amplifier 19 is detected to be above a predetermined level, then power detector 139 asserts the signal Vcon to the digital logic high value, otherwise power detector 139 keeps the signal Vcon at the digital logic low value. Assuming the power amplifier 8 has a fixed power gain, then the predetermined level detected by power detector 139 can be made to correspond to any desired power output level of power amplifier 8.

In the first operating mode, power amplifier 8 drives load 104 with a higher average output power. Signal Vcon has a digital high level. Signal Vcon therefore causes analog multiplexer circuit 107 to couple node 140 to the input node 141 of the first Class AB amplifier circuit 109 and to decouple node 140 from the input node 142 of the second Class AB amplifier circuit 110. Second Class AB amplifier circuit 110 is said to be disabled. N-channel transistors 143 and 144 are conductive (are ON), whereas N-channel transistors 145 and 146 are non-conductive (are OFF). The signal path extends from source 101, through driver stage 105, through interstage matching network 106 to node 140, through first Class AB amplifier circuit 109 to a summing node 147, through output matching network 103, and to load 104.

In this embodiment, each of transistors 143-146 actually includes one hundred (100) parallel-connected N-channel field effect transistors having a W/L of 45 μm/0.25 μm. Each of transistors 143-146 is therefore a large device to keep insertion loss into the first and second Class AB amplifier circuits 109 and 110 low.

In the second operating mode, power amplifier 8 drives load 104 with a lower average output power. Digital control signal Vcon has a digital low level. Analog multiplexer circuit 107 therefore couples node 140 to the input node 142 of the second Class AB amplifier circuit 110 and decouples node 140 from the input node 141 of the first Class AB amplifier circuit 110. First Class AB amplifier circuit 109 is said to be disabled. N-channel transistors 145 and 146 are conductive (ON), whereas N-channel transistors 143 and 144 are non-conductive (OFF). The signal path extends from source 101, through driver stage 105, through inter-stage matching network 106 to node 140, through second Class AB amplifier circuit 110 to summing node 147, through output matching network 103, and to load 104.

Accordingly, in the first operating mode, the first Class AB amplifier circuit 109 is used to drive output terminal 117 and load 104. In one example, transistor(s) 121 is biased to have the lowest conduction angle that achieves the linearity required by the cellular communication standard employed. Reducing the conduction angle increases efficiency. In the second operating mode, on the other hand, the second Class AB amplifier circuit 110 is used to drive output terminal 117 and load 104. The transistors 124 and 125 of the second Class AB amplifier circuit are biased with a lower DC bias voltage and a lower DC bias collector current, so that DC power is not wasted when operating at the lower output power level of the second operating mode.

The power gain of the overall power amplifier 8 is substantially the same, regardless of whether the power amplifier 8 is operating in the first operating mode or the second operating mode. Changes in power gain in power amplifiers using conventional dynamic current biasing are usually due to changes in current density in the power transistors. In the embodiment of FIG. 3, the current density in SiGe HBT transistor 121 is roughly the DC bias current divided by the emitter area of transistor 121. The emitter area of one of the HBT transistor is the product of the emitter width and the emitter length. The overall emitter area is the sum of the emitter areas of the one hundred constituent transistors that make up transistor 121. Similarly, the current density in SiGe HBT transistors 124 and 125 is roughly the DC bias current divided by the emitter area of transistor 124 or transistor 125. Each of the constituent HBT transistors that makes up transistor 124 and transistor 125 is of identical size to the HBT transistors that make up transistor 121 of the first Class AB amplifier 109. There are, however, only twenty of such HBT transistors in each of transistors 124 and 125 of the second Class AB amplifier circuit 110. The total emitter area of the transistors 124 and 125 of the second Class AB amplifier circuit 110 is therefore twenty percent of the total emitter area of transistor 121 of the first Class AB amplifier circuit 109. Because the DC bias current in second Class AB amplifier circuit 110 is set to be twenty milliamperes and the DC bias current in first Class AB amplifier circuit 109 is set to be one hundred milliamperes, the current densities within the power transistors in the two amplifier circuits is identical. Keeping the current densities of two amplifier circuits the same facilitates keeping the power gains of the two amplifier circuits identical.

There are, however, other factors in maintaining the power gain identical in the two operating modes. The output connection between the output of the first Class AB amplifier circuit 109 and the output of the second Class AB amplifier circuit 110 adds parasitics to the output of each amplifier, which reduces overall power gain. The added parasitics, however, serve to decrease any difference between the power gains of the two amplifiers because the input impedance of the second stage changes little when switching between the first and second operating modes.

A resonating technique is also employed to help assure that the power gain of power amplifier 8 is the same in each of the two operating modes. The connection between the output of the second Class AB amplifier circuit 110 and summing node 147 and the connection between first Class AB amplifier circuit 109 and summing node 147 are optimized to boost the gain in the second operating mode (the low-power operating mode) by partially resonating the output capacitance of the first Class AB amplifier circuit 109. Because the output impedance of second Class AB amplifier circuit 110 is higher than that of the Class AB amplifier circuit 109, the parasitic capacitance on node 147 has a larger degrading effect on the low-power gain. By partially resonating the parasitic capacitance in second operating mode (low-power operation), the gain difference between the first and second operating modes is further reduced.

In the illustrated embodiment, inductance 148 is the inductance of the conductor between the output of second Class AB amplifier circuit 110 and summing node 147. Inductance 148 has a value of approximately 0.2 nH and the magnitude of this inductance is determined by the layout of the conductor. Inductance 148 is set to achieve resonance. Capacitor symbol 149 represents the output capacitance of the first Class AB amplifier circuit. It has a capacitance of approximately 5 pF. Capacitor symbol 150 represents the parasitic capacitance on the output of second Class AB amplifier circuit 110. It has a value of approximately 1 pF. Capacitors 151 and 152 have values of 20 pF. When these values are used, the beneficial gain-stabilizing resonating is achieved.

Figure 6:
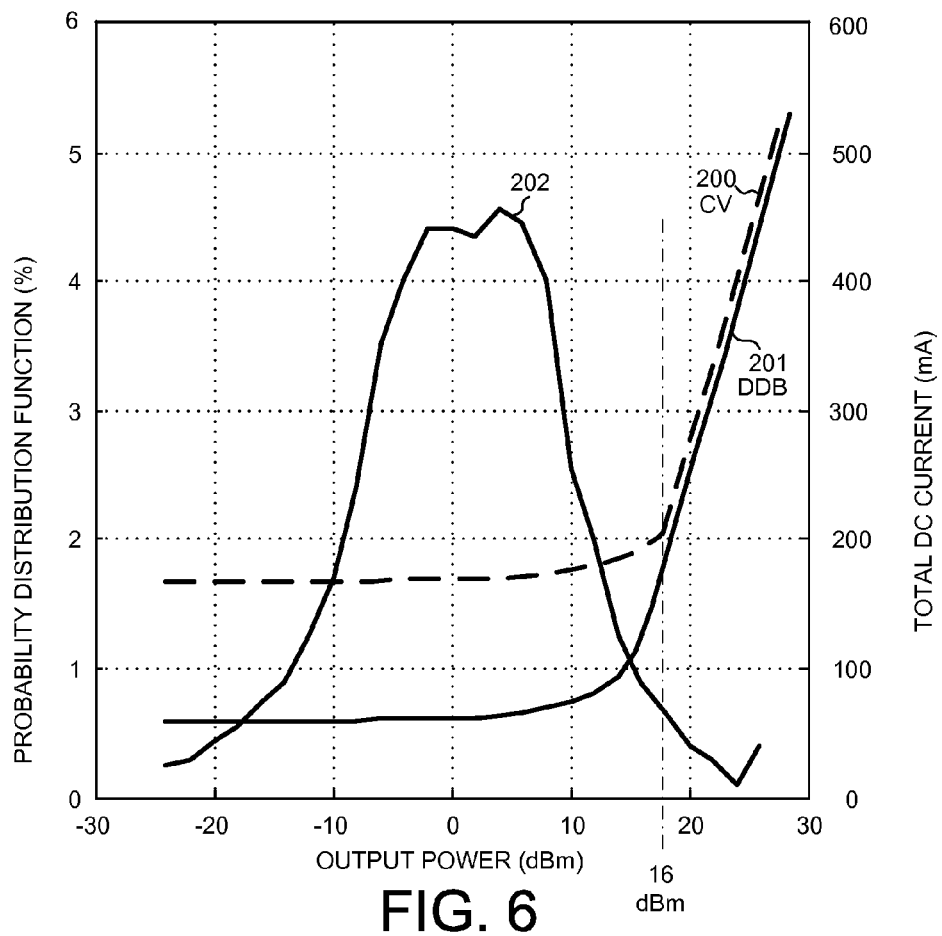
FIG. 6 is a diagram that shows the total DC current consumed by the power amplifier of FIG. 3 versus output power of the power amplifier.

FIG. 6 is a diagram that shows the output power of power amplifier 8 in the horizontal dimension. Total DC bias current is shown in the vertical dimension (see the scale to the right of the diagram). Dashed line 200 shows what the DC bias current would be if conventional constant voltage biasing (CV) were employed. Line 201 shows the DC bias current drawn by power amplifier 8 of FIG. 3. The "DDB" label indicates "Dual Dynamic Biasing", a term that is used to describe the technique employed by power amplifier 8 of FIG. 3. The predetermined output power that determines whether the power amplifier operates in the first operating mode or the second operating mode is 16 dBm. As FIG. 6 shows, power amplifier 8 draws less DC bias current when operating at lower output powers below 16 dBm.

There is a scale to the left of FIG. 6 entitled "Probability Distribution Function %". This scale is for curve 202 which is a CDMA probability distribution function (PDF) as a function of power amplifier output power. Empirical data of cellular telephone use is collected and analyzed to determine what percentage of the time the cellular telephone is to transmit with which output power levels. The left leg of curve 202 indicates that only a small percentage of the time is the cellular telephone operating a very low power levels. The right leg of curve 202 indicates that only a small percentage of the time is the cellular telephone operating at very high power levels. The central peak of curve 202 indicates that most of the time the cellular amplifier is operating at the midrange power levels. Note that the line 201 crosses this midrange power level area at a lower DC bias current level than does line 200. This represents a substantial power savings and extension of the amount of time the cellular telephone can operate from a single charge of its battery.

Figure 7:
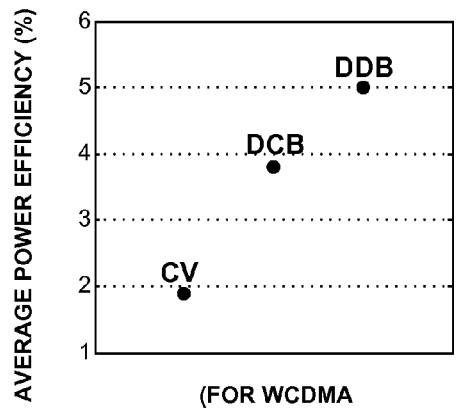
FIG. 7 is a diagram that shows the average power efficiency of the power amplifier of FIG. 3 in comparison to power amplifiers that utilize two other conventional dynamic biasing techniques.

FIG. 7 is a chart that shows the average power efficiency of power amplifier 8 of FIG. 3 to be about five percent for a WCDMA output power PDF (Probability Distribution Function). The label "DDB" indicates Dual Dynamic Biasing and identifies the data point for power amplifier 8. The point labeled "DCB" identifies a data point for a power amplifier that uses the conventional Dynamic Current Biasing technique. The point labeled "CV" identifies a data point for a power amplifier that uses Constant Voltage biasing without any dynamic bias technique.

Figure 8:
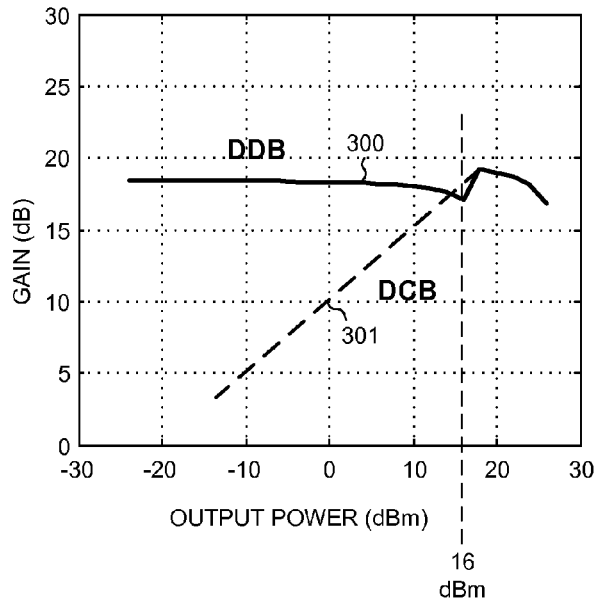
FIG. 8 is a diagram that shows how the power gain of the power amplifier of FIG. 3 is stable over a wide output power range.

FIG. 8 is a graph that shows how constant the power gain is of the power amplifier 8 of FIG. 3 over a large output power range. The line 300 labeled "DDB" indicates the power gain of power amplifier 8 of FIG. 3. The power gain of power amplifier 8 varies by less than five dB when the output power varies over a forty dB range. The line 301 labeled "DCB" indicates what the power gain would be of a conventional power amplifier using the dynamic current biasing technique. The vertical dashed line at 16 dBm identifies the predetermined output power level that determines whether power amplifier 8 operates in the first operating mode or the second operating mode. The line 301 indicates a more than 15 dB gain variation.

Figure 9:
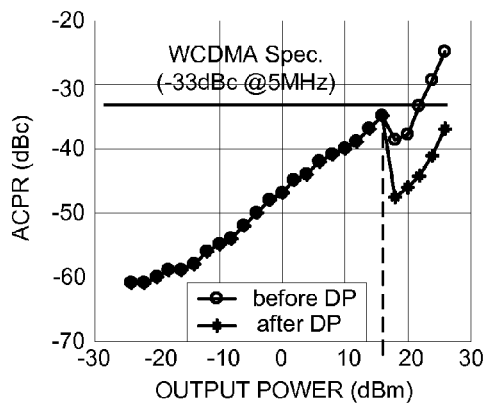
FIG. 9 shows the linearity of the power amplifier of FIG. 3 measured in terms of ACPR (Adjacent Channel Power Ratio) at 5 MHz.

FIG. 9 shows the linearity of PA 8 measured in terms of ACPR (Adjacent Channel Power Ratio) at 5 MHz for two cases: with and without digital predistortion (DP). A memoryless digital predistortion linearizer is used, but it is only used in the first operating mode (high-power mode) above 16 dBm. This is the reason for the discontinuity in ACPR in the "after DP" curve. The ACPR is improved by at least 8 dB with digital predistortion, and the maximum output power satisfying the WCDMA linearity specification is improved from 22.4 dBm to 26 dBm. Power amplifies 8 has an ACPR (Adjacent Channel Power Ratio) of better than −33 dBc for power amplifier output powers up to 26 dBm. This satisfies the WCDMA Class 3 requirement of maximum output power. Correspondingly, the peak PAE (power-added efficiency) is improved by sixty percent (from 17% to 27%).

Figure 10:
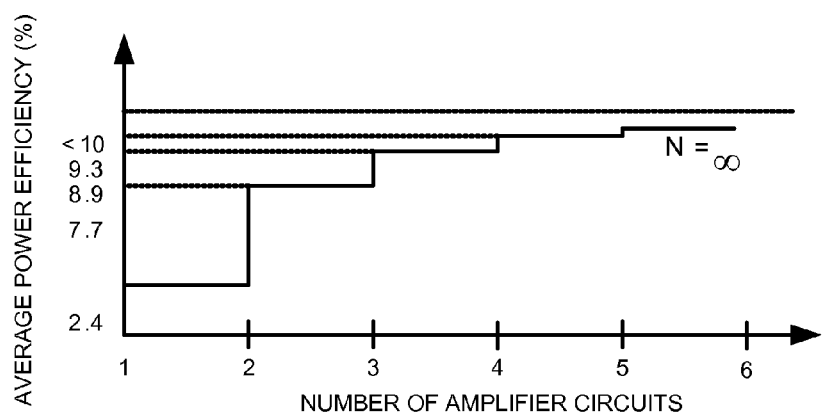
FIG. 10 is a diagram illustrating the average power efficiencies that can be achieved by expanding the technique of using a different Class AB amplifier circuit for each different output power operating mode to three or more different Class AB amplifier circuits and three or more corresponding output power operating modes.

The technique of using a different Class AB amplifier circuit for each of a plurality of output power ranges can be expanded to use more than two Class AB amplifier circuits. FIG. 10 is a comparison of average power efficiencies achieved versus the number of Class AB amplifier circuits employed. A power amplifier may, for example, employ three different Class AB amplifier circuits and two predetermined output power levels that determine which of the three amplifier circuits will be used under a given operating condition. Several factors influence the optimum number of Class AB power amplifier circuits, including: the added complexity and parasitics associated with more amplifier circuits and a large analog multiplexer, gain variation, and reduced power consumption at the lowest output power levels. For example, using three Class AB amplifier circuits achieves better average efficiency (8.9%) than its counterpart (see FIG. 3) that uses only two Class AB amplifier circuits. However, the corresponding circuit complexity increases and the achievable power gain drops due to added parasitics. Adding still more amplifier circuits results in further diminishing returns, so the topology of FIG. 3 involving two Class AB power amplifier circuits is adopted in cellular telephone 1 of FIG. 1.

Figure 11:
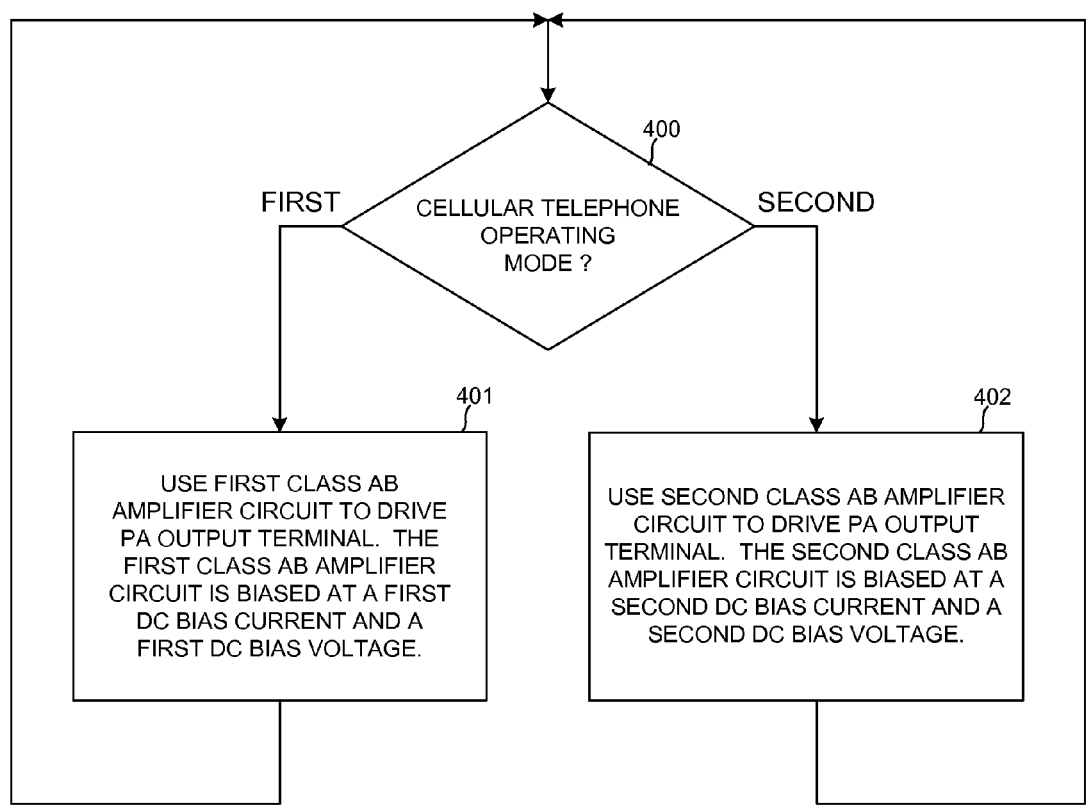
FIG. 11 is a simplified flowchart of a method in accordance with one novel aspect.

FIG. 11 is a simplified flowchart diagram of a method in accordance with one novel aspect. A determination is made (step 400) as to whether the cellular telephone is operating in a first operating mode or a second operating mode. In one example, the first operating mode is a "talk" mode, and the second operating mode is a "wait" mode. In one example, digital baseband integrated circuit 4 makes the determination and outputs a digital signal Vcon, the digital logic level of which indicates whether the cellular telephone is operating in the first operating mode or the second operating mode.

If the cellular telephone is operating in the first operating mode, then a first Class AB amplifier circuit is used (step 401) to drive a power amplifier (PA) output terminal. A power transistor (made up of multiple parallel-connected transistors) within the first Class AB amplifier circuit is biased at a first DC bias collector current and at a first DC bias collector-to-emitter voltage.

If, on the other hand, the cellular telephone is operating in the second operating mode, then a second Class AB amplifier circuit is used (step 402) to drive the power amplifier (PA) output terminal. A power transistor (made up of multiple parallel-connected transistors) within the second Class AB amplifier circuit is biased at a second DC bias collector current and at a second DC bias collector-to-emitter voltage. Where the first operating mode is a mode that involves operating the power amplifier at higher output powers as compared to the second operating mode, the first DC bias collector current is greater than the second DC bias collector current, and the first DC bias collector-to-emitter voltage is greater than the second DC bias collector-to-emitter voltage. By sizing the power transistors in the first and second Class AB amplifier circuits appropriately, the emitter current densities in the power transistors of the first and second Class AB amplifier circuits are maintained substantially equal in the two operating modes such that the power gain of the power amplifier is substantially identical in each of the two operating modes.

Although certain specific embodiments are described above for instructional purposes, the teachings of this patent document have general applicability and are not limited to the specific embodiments described above. Although the first and second amplifier circuits are Class AB amplifiers in the example of FIG. 3 above, the technique of using a different amplifier circuit to drive a power amplifier output terminal in each of a plurality of different operating modes can involve other classes of amplifiers. Not all the amplifiers used need to operate in the same class. A first amplifier that is used in a first operating mode can operate in Class AB and a second amplifier that is used in a second operating mode can operate in Class C, for example. Although amplifier circuits 109 and 110 are referred to above as Class AB amplifier circuits, amplifier circuits 109 and 110 can for a small proportion of the time be operating with conduction angles of other classes of amplifiers. For example, in some embodiments, Class AB amplifier 110 is for short period of time driven so hard that the degree to which it clips causes its conduction angle to reach 180 degrees but this degree of clipping occurs for only a very small fraction of the time. Accordingly, various modifications, adaptations, and combinations of the various features of the described specific embodiments can be practiced without departing from the scope of the claims that are set forth below.

What is claimed is:

1. A method comprising:

in a first operating mode, driving first signals onto an output terminal using a first Class AB amplifier circuit, wherein the first Class AB amplifier circuit includes a first power transistor that is biased at a first bias current I1 and at a first collector-to-emitter bias voltage V1, wherein the first signals are in a frequency band above one gigahertz, and wherein a second Class AB amplifier circuit is disabled during the first operating mode; and in a second operating mode, driving second signals onto the output terminal using the second Class AB amplifier circuit, wherein the second Class AB amplifier circuit includes a second power transistor that is biased at a second bias current I2 and at a second collector-to-emitter bias voltage V2, wherein I1>I2, wherein V1>V2, wherein the first Class AB amplifier circuit is disabled during the second operating mode, wherein the second signals are in the frequency band above one gigahertz, and wherein the first and second Class AB amplifier circuits are integrated onto a single integrated circuit.

2. The method of claim 1, wherein the single integrated circuit is a WCDMA (Wideband Code Division Multiple Access) power amplifier integrated circuit.

3. The method of claim 1, wherein the first operating mode is a mode in which the first Class AB amplifier circuit delivers a higher average output power through the output terminal, wherein the second operating mode is a mode in which the second Class AB amplifier circuit delivers a lower average output power through the output terminal.

4. The method of claim 1, further comprising:
receiving a digital signal onto a terminal of the single integrated circuit, wherein if the digital signal has a first digital logic value then the first Class AB amplifier circuit drives the output terminal in the first operating mode, and wherein if the digital signal has a second digital logic value then the second Class AB amplifier circuit drives the output terminal in the second operating mode.

5. The method of claim 4, further comprising:
using a power detector to generate the digital signal.

6. The method of claim 4, further comprising:
generating the digital signal in a digital baseband integrated circuit.

7. The method of claim 1, wherein the second Class AB amplifier circuit further comprises a third power transistor, wherein in the second operating mode the second bias current I2 flows in a current path from a supply voltage node, through the second power transistor, through the third power transistor, and to a ground node.

8. The method of claim 1, wherein the first and second Class AB amplifier circuits are parts of a power amplifier, and wherein the power amplifier has a power gain that varies by less than five dB when an output power of the power amplifier varies over a forty dB range.

9. The method of claim 1, wherein the first power transistor in the first operating mode has a first DC bias current density, and wherein the second power transistor in the second operating mode has a second DC bias current density, wherein the first and second DC bias current densities are substantially identical.

10. The method of claim 1, wherein the first and second Class AB amplifier circuits are parts of a power amplifier, and wherein the power amplifier has an average power efficiency (APE) greater than four percent for a WCDMA (Wideband Code Division Multiple Access) output power PDF (Probability Distribution Function).

11. The method of claim 1, further comprising:
using an inductance to partially resonate an output capacitance of the first Class AB amplifier circuit, wherein an output node of the first Class AB amplifier circuit is coupled by a first conductor to a summing node, wherein the inductance is an inductance of a second conductor that extends from an output node of the second Class AB amplifier circuit and to the summing node.

12. The method of claim 1, wherein the first power transistor comprises a plurality of transistors that are connected in parallel, and wherein the second power transistor comprises a plurality of transistors that are connected in parallel.

13. The method of claim 1, wherein the first power transistor has an emitter and a collector, wherein the emitter is connected to a ground node, and wherein the collector is connected to the output terminal.

14. A circuit comprising:
an output terminal;
a first amplifier having an input lead and an output lead, the output lead being coupled to the output terminal, wherein the first amplifier includes a first power transistor that is biased at a first bias current I1 and at a first bias voltage V1;
a second amplifier having an input lead and an output lead, the output lead being coupled to the output terminal, wherein the second amplifier includes a second power transistor that is biased at a second bias current I2 and at a second bias voltage V2; and
an analog multiplexer having an input lead, a first output lead, a second output lead, and a select input lead, wherein if a first digital logic value is present on the select input lead then the analog multiplexer couples a signal on its input lead through the first output lead and onto the input lead of the first amplifier such that the first amplifier drives a power-amplified version of the signal onto the output terminal, wherein if a second digital logic value is present on the select input lead then the analog multiplexer couples the signal on its input lead through the second output lead and onto the input lead of the second amplifier such that the second amplifier drives a power-amplified version of the signal onto the output terminal, wherein the signal on the input lead of the multiplexer is in a frequency band above one gigahertz, wherein I1>I2, wherein V1>V2, wherein the first power transistor has a first DC bias current density when the first amplifier is driving the output terminal, wherein the second power transistor has a second DC bias current density when the second amplifier is driving the output terminal, wherein the first and second DC bias current densities are substantially identical.

15. The circuit of claim 14, wherein the circuit is an integrated circuit, the circuit further comprising:
an input terminal that is coupled to the select input lead of the analog multiplexer, wherein the input terminal and the output terminal are terminals of the integrated circuit.

16. The circuit of claim 14, further comprising:
a power detector that generates a digital signal, the digital signal being supplied onto the select input lead of the analog multiplexer.

17. The circuit of claim 14, wherein the circuit is a WCDMA (Wideband Code Division Multiple Access) power amplifier integrated circuit.

18. The circuit of claim 17, wherein the power amplifier has an average power efficiency (APE) greater than four percent for a WCDMA (Wideband Code Division Multiple Access) output power PDF (Probability Distribution Function).

19. The circuit of claim 14, wherein the second amplifier further includes a third power transistor, wherein the second bias current I2 flows in series through the second power transistor and then through the third power transistor.

20. The circuit of claim 14, wherein the circuit is a part of a driver amplifier in a transmitter chain, wherein the power-amplified version of the signal is output by the driver amplifier and is further amplified by a power amplifier.

21. A power amplifier capable of amplifying signals in a frequency band above one gigahertz with a power gain that varies by less than five dB when an output power of the power amplifier varies over a forty dB range, wherein the power amplifies has an ACPR (Adjacent Channel Power Ratio) of better than −33 dBc for power amplifier output powers up to 26 dBm, and wherein the power amplifier has an average power efficiency (APE) greater than four percent for a WCDMA (Wideband Code Division Multiple Access) output power PDF (Probability Distribution Function).

22. The power amplifier of claim 21, wherein the power amplifier is part of an integrated circuit and comprises:
   an output terminal from which the power amplifier outputs an amplified version of the signals in the frequency band;
   a first amplifier circuit having an input and an output, wherein the output of the first amplifier circuit is coupled to the output terminal;
   a second amplifier circuit having an input and an output, wherein the output of the second amplifier circuit is coupled to the output terminal; and
   an analog multiplexer having a first output and a second output, wherein the first output is coupled to the input of the first amplifier circuit, and wherein the second output is coupled to the input of the second amplifier circuit.

23. The power amplifier of claim 22, wherein the integrated circuit further comprises:
   a control terminal that is coupled to a select input of the analog multiplexer.

* * * * *